United States Patent
Gao

(10) Patent No.: US 10,897,836 B2
(45) Date of Patent: Jan. 19, 2021

(54) AIRFLOW MANAGEMENT SYSTEM FOR THERMAL CONTROL OF DATA CENTERS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 15/966,995

(22) Filed: Apr. 30, 2018

(65) Prior Publication Data
US 2019/0335623 A1 Oct. 31, 2019

(51) Int. Cl.
*H05K 7/20* (2006.01)

(52) U.S. Cl.
CPC ........... *H05K 7/20745* (2013.01); *H05K 7/20* (2013.01); *H05K 7/202* (2013.01); *H05K 7/20145* (2013.01); *H05K 7/20754* (2013.01)

(58) Field of Classification Search
CPC ............... H05K 7/20145; H05K 7/202; H05K 7/20745; H05K 7/20754; H05K 7/20718–20745
USPC .. 361/679.48, 679.49, 679.5, 690, 695, 696, 361/701
See application file for complete search history.

(56) References Cited

U.S. PATENT DOCUMENTS

| | | | | |
|---|---|---|---|---|
| 8,941,256 B1* | 1/2015 | Czamara | ................... | F03D 9/00 290/55 |
| 9,072,193 B1* | 6/2015 | Eichelberg | ........... | H05K 7/1488 |
| 9,445,531 B1* | 9/2016 | Heydari | .............. | H05K 7/20827 |
| 9,723,762 B1* | 8/2017 | Ross | ................... | H05K 7/20836 |
| 9,920,750 B1* | 3/2018 | Ross | ....................... | F03G 7/065 |
| 2009/0210096 A1* | 8/2009 | Stack | ....................... | F24F 11/30 700/278 |
| 2010/0061059 A1* | 3/2010 | Krietzman | ......... | H05K 7/20745 361/690 |
| 2011/0223849 A1* | 9/2011 | Ishimine | ................. | F24F 3/044 454/184 |
| 2012/0006038 A1* | 1/2012 | Sharma | .............. | H05K 7/20745 62/97 |

(Continued)

FOREIGN PATENT DOCUMENTS

| CN | 104010477 | 8/2014 |
|---|---|---|
| CN | 205980106 | 2/2017 |

(Continued)

*Primary Examiner* — Stephen S Sul
(74) *Attorney, Agent, or Firm* — Womble Bond Dickinson (US) LLP

(57) ABSTRACT

An airflow management system is utilized to manage airflows of a data center system, which has an efficient airflow arrangement, simplified and modularized building design, and high efficiency. The cold air and hot air are segregated. With wall supply and wall return mechanisms, the air flow is concentrated, distributed, and then concentrated again with simple management. The system substantially eliminates significant amount of air duct requirement and no return air plenum is needed. High efficiency results in less blower power consumption due to less airflow resistance and hot air recirculation is greatly reduced. The cold aisles and the hot aisles are completely separated as operators can enter and leave the cold aisles and hot aisles with minimal impacts. The system can be implemented in a modular manner and it is easy for heat recovery or reuse solution deployment in the hot air room.

18 Claims, 7 Drawing Sheets

(56) References Cited

U.S. PATENT DOCUMENTS

| | | | | |
|---|---|---|---|---|
| 2013/0078901 A1* | 3/2013 | Curtin | ............... | H05K 7/20745 454/184 |
| 2013/0098597 A1* | 4/2013 | Fujimoto | ........... | H05K 7/20745 165/287 |
| 2014/0002987 A1* | 1/2014 | Okitsu | ............... | H05K 7/20836 361/679.48 |
| 2014/0059946 A1* | 3/2014 | Gardner | .............. | E04B 1/34384 52/64 |
| 2014/0298839 A1* | 10/2014 | Nagamatsu | ........ | H05K 7/20745 62/186 |
| 2015/0114601 A1 | 4/2015 | Chainer et al. | | |
| 2015/0123562 A1 | 5/2015 | Adriaenssens et al. | | |
| 2016/0324036 A1* | 11/2016 | Slessman | ........... | H05K 7/20145 |
| 2017/0196125 A1* | 7/2017 | Crosby, Jr. | ......... | H05K 7/20745 |
| 2018/0124955 A1* | 5/2018 | Rogers | ............... | H05K 7/20727 |
| 2018/0338393 A1* | 11/2018 | Curtin | ............... | H05K 7/20745 |
| 2019/0179384 A1* | 6/2019 | Sato | ................... | H05K 7/20381 |

FOREIGN PATENT DOCUMENTS

| | | |
|---|---|---|
| CN | 107683072 | 2/2018 |
| CN | 107969098 | 4/2018 |
| WO | 2017164326 | 9/2017 |

\* cited by examiner

AIRFLOW MANAGEMENT SYSTEM FOR THERMAL CONTROL OF DATA CENTERS

FIELD OF THE INVENTION

Embodiments of the present invention relate generally to data centers. More particularly, embodiments of the invention relate to airflow management of data centers for thermal management.

BACKGROUND

Heat removal is a prominent factor in computer system and data center design. The number of servers deployed within a data center has steadily increased as server performance has improved, thereby increasing the amount of heat generated during the regular operation of the servers. The reliability of servers used within a data center decreases if the environment in which they operate is permitted to increase in temperature over time. A significant portion of the data center's power is used for cooling electronics at the server level. As the number of servers within a data center increase, a greater portion of the power is commensurately consumed by the data center to cool electronic components within the servers.

Airflow bypass and hot air recirculation are commonly seen in a data center. This is caused by the airflow forming a short path instead of passing through the computer equipment and electronics which need to be cooled. The hot air recirculation is a phenomenon that the hot exhaust air recirculates back to cooling air side and mixed with the cooling air instead of returning back to the cooling equipment directly. This creates hot spot in data centers which is a major challenge in traditional air cooling data centers. The hot spot may significantly impact the cooling performance and cooling efficiency. There has been a lack of efficient way to provide efficient airflow managements for thermal management of data centers.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
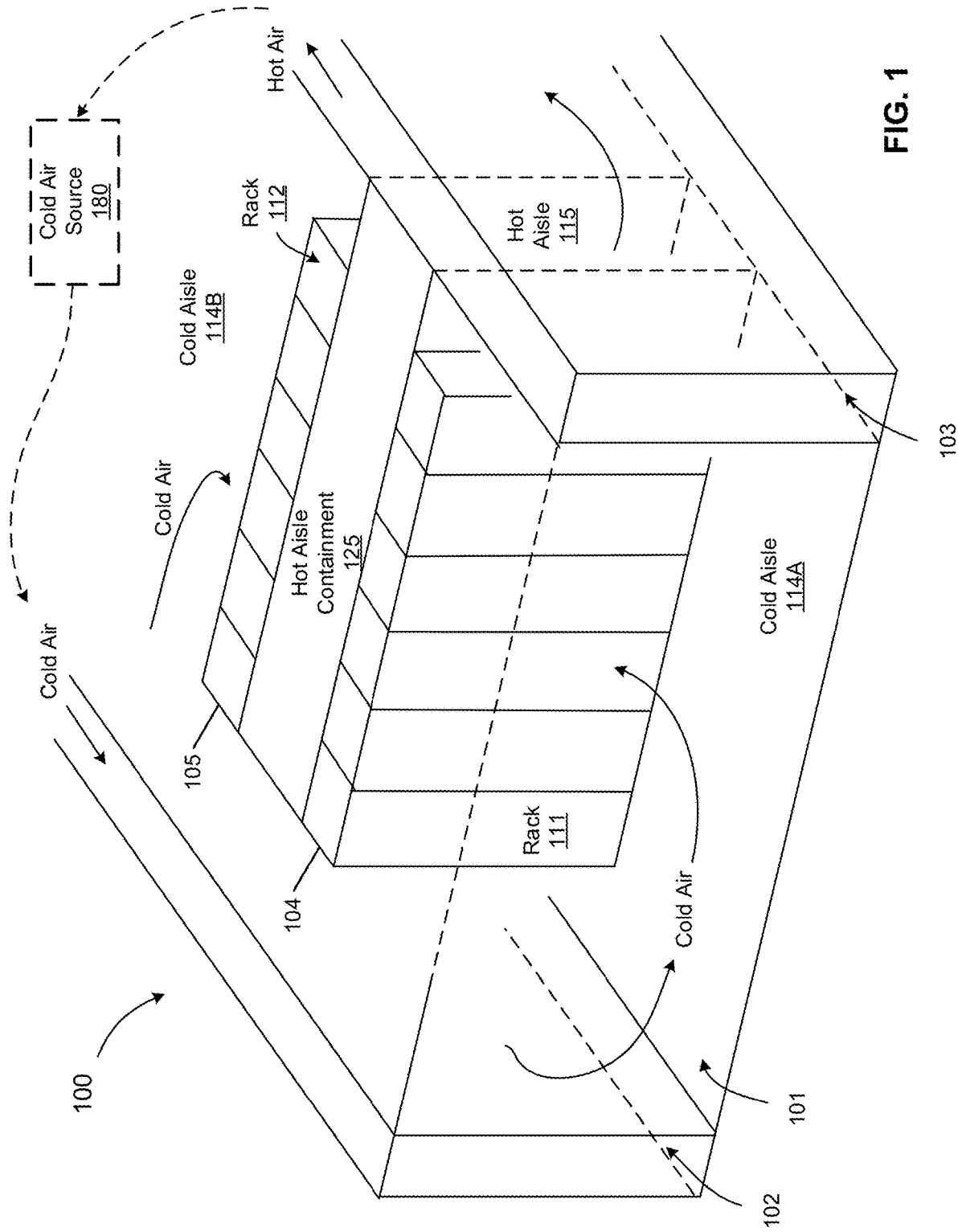
FIG. 1 shows a perspective view of a data center system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, an airflow management system is utilized to manage airflows of a data center system, which has an efficient airflow arrangement, simplified building design, and high efficiency. The cold air and hot air are segregated. With wall supply and wall return mechanisms, the air flow is concentrated, distributed, and then concentrated again with simple management. The system substantially eliminates significant amount of air duct requirement and no return air plenum is needed. High efficiency results in less blower power consumption due to less airflow resistance and hot air recirculation is greatly reduced. The airflow path design on both supply side and return side has been simplified and redundant support for indirect evaporative cooling/cooler (IDEC) support and compliance. The cold aisles and the hot aisles are completely separated as operators can enter and leave the cold aisles and hot aisles with minimal impacts. The design minimizes the impact of dynamic variations of the IDEC units on data center rooms. The system can be implemented in a modular manner and it is easy for heat recovery or reuse solution deployment in the hot air room.

According to one embodiment, a data center system includes an information technology (IT) room containing a number of electronic racks. Each electronic rack includes a number of IT components arranged in a stack. The electronic racks are arranged in one or more rows of electronic racks to form one or more cold aisles and one or more hot aisles. Each row of electronic racks is positioned between a cold aisle and a hot aisle to allow an airflow flowing from the cold aisle to the hot aisle through airspace of the electronic racks to exchange heat generated from the IT components. The date center system further includes a cold air room and a hot air room. The cold air room is positioned adjacent to a first side of the IT room. The cold air room is to receive cold air from a cold air source and to distribute the cold air to the cold aisles. The hot air room is positioned adjacent to a second side of the IT room, where the first side and the second side are opposite sides of the IT room. The hot air room is to receive hot air from the hot aisles and to return the hot air to the cold air source for heat exchange.

In one embodiment, each electronic rack includes a frontend and a backend. The frontend is facing a cold aisle and the backend is facing a hot aisle. The airflow is flowing from a cold aisle, entering the airspace of the electronic rack, and into a hot aisle. In one embodiment, each hot aisle is enclosed by a hot aisle containment structure or container to contain and prevent hot air from spilling into the cold aisles of the IT room. The hot air is exhausted from the hot aisle into the hot air room through one or more openings (e.g., windows, doors) disposed on a wall between the hot air room and the IT room. The wall may further include a door to allow an operator or user to enter the hot aisle to access at least the backend of the electronic racks, for example, for providing maintenance and/or repair services. Similarly, the wall between the IT room and the cold air room may include one or more doors to allow an operator to enter at least the cold aisles of the IT room to access the frontends of the electronic racks, for example, for providing maintenance and/or repair services.

FIG. 1 shows a perspective view of a data center system according to one embodiment. Referring to FIG. 1, data center system 100 includes an IT room 101, a cold air room 102, and a hot air room 103. IT room 101 includes a number of electronic racks such as electronic racks 111-112. Each electronic rack contains one or more IT components arranged in a stack. An IT component can be a computer server providing data services to clients. Alternatively an IT component can be a peripheral device or a network appliance device such as cloud storage systems. Each IT component may include one or more processors, memory, and/or a storage device that may generate heat during operations. The electronic racks are arranged in a number of rows of electronic racks, in this example, rows 104-105 of electronic racks. The rows of electronic racks are arranged spaced apart to form one or more cold aisles and one or more hot aisles. In this embodiment, although there are only two rows 104-105 of electronic racks shown, there can be more rows to be contained in IT room 101.

In one embodiment, each row of electronic racks is positioned or sandwiched between a cold aisle and a hot aisle. In this example, row 104 and row 105 are positioned apart from each other to form cold aisle 114A, hot aisle 115, and cold aisle 114B. Hot aisle 115 is formed between row 104 and row 105. Row 104 is positioned or sandwiched between cold aisle 114A and hot aisle 115, while row 105 is positioned or sandwiched between cold aisle 114B and hot aisle 115. In one embodiment, hot aisle 115 is contained or enclosed by hot aisle containment (or container or other enclosures). In another embodiment, the cold aisles are contained in a containment environment instead of the hot aisles. In a further embodiment, both hot aisles and cold aisles are contained in an enclosed environment. In one embodiment, the backend of the electronic racks of rows 104-105 are facing hot aisle 115, while the frontends of the electronic racks are facing cold aisle 114A or cold aisle 114B and away from hot aisle 115.

In one embodiment, cold air room 102 is located and adjacent to a first side of IT room 101, while hot air room 103 is located and adjacent to a second side of IT room 101. In this example, the first side and the second side are opposite sides of IT room 101. Cold air room 102 is configured to receive cold air or cool air via one or more inlet ports from a cold air source such as cold air source 180. The cold air is allowed to enter IT room 101 from cold air room 102 via one or more openings disposed on the wall between cold air room and IT room 101 (not shown). The cold air entering IT room 101 to form cold aisles 114A-114B.

Hot air room 103 is configured to exhaust the hot air from hot aisle 115 and return the hot air or warmer air back to the cold air source for heat exchange. Note that cold air source 180 can include a heat exchanger or chiller. For example, cold air source 180 can be an IDEC system or device. Alternatively, cold air source 115 can simply be the natural ambient air outside of the data center system 100.

An evaporative cooler is a device that cools air through the evaporation of water. Evaporative cooling differs pica (air conditioning systems, which use vapor compression or absorption refrigeration cycles. Evaporative cooling works by exploiting water's large enthalpy of vaporization. The temperature of dry air can be dropped significantly through the phase transition of liquid water to water vapor (evaporation). Direct evaporati cooling; is used to lower the temperature and increase the humidity of air by using latent heat of evaporation, changing liquid water to water vapor. In this process, the energy in the air does not change. Warm dry air is changed to cool irioist air. The heat of the outside air is used to evaporate water indirect evaporative cooling is a cooling process that uses direct evaporative cooling in addition to some type of heat exchanger to transfer the cool energy to the supply air. The cooled moist air from the direct evaporative cooling process never comes in direct contact with the conditioned supply air.

Referring back to FIG. 1, in this example, the cold air is received from one or more inlets or inlet ports disposed on a wall of cold air room 102, where the wall is substantially parallel with a third side of IT room 101. The third side of IT room 101 is substantially perpendicular to the first side and the second side, while the first side and the second side are substantially parallel to each other. Similarly, the hot air is exhausted from hot air room 103 to the external environment or back to cold air source 180 via one or more outlets or outlet ports disposed on a wall of hot air room 102, where the wall is substantially parallel with the third side of IT room 101.

According to one embodiment, hot aisle 115 is enclosed or contained within hot aisle containment 120, such that the hot air cannot escape or spill from hot aisle 115 into other areas of IT room 101 such as cold aisles 114A-114B. Instead, the hot aisle enters hot air room 103 from hot aisle via one or more openings (e.g., windows, doors) disposed on a wall between hot aisle 115 and hot air room 103. In one embodiment, the openings allow an operator or a user to enter hot aisle 115 from hot air room 103 to access the backend of the electronic racks, for example for maintenance services. Doors are needed on the 102 and 103, for operators to be able to enter cold air room 102 and hot air room 103. And no door is needed on hot aisle 115, and doors are needed on the walls between cold air room 102 and IT room 101, according to some embodiments. Similarly, the openings disposed on the wall between cold air room 102 and IT room 101 may include one or more doors to allow an operator or user to enter cold aisles 114A-114B from cold air room 102. As a result, entering or leaving cold aisles or hot aisles would not have a significant impact on the cold air distribution and hot air exhaustion. That is, entering or leaving hot aisle 115 would not alter cold air distribution for cold aisles 114A-114B, because hot aisle 115 is separated from cold aisles 114A-114B and the rest of IT room 101 by hot aisle containment 120. Similarly, entering or leaving cold aisles 114A-114B would not affect hot air exhaustion of hot aisle 115, since opening a door for a user to enter or leave would not mix the cold air and the hot air.

Figure 2:
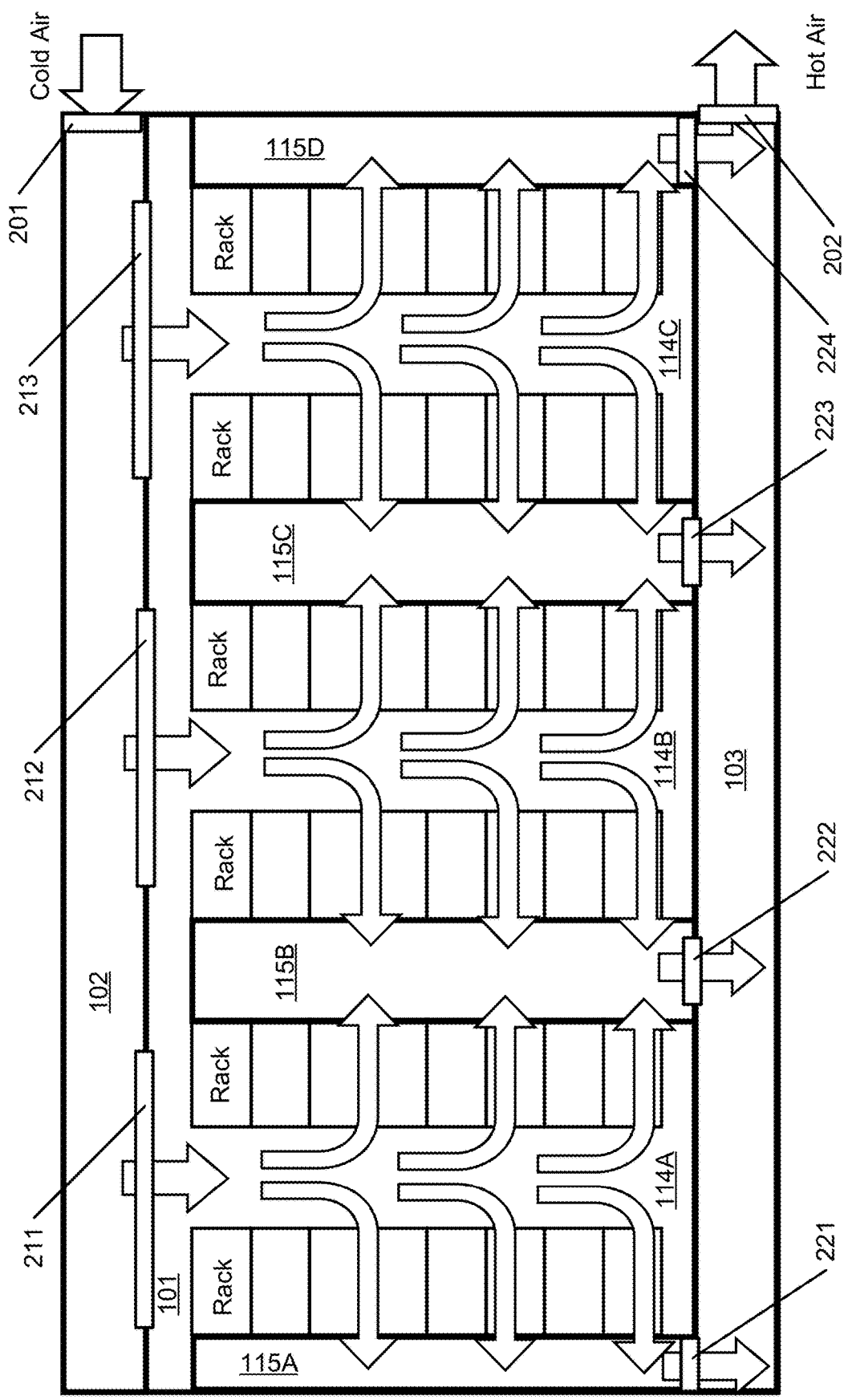
FIG. 2 shows a top view of a data center system according to one embodiment.

FIG. 2 shows a top view of a data center system according to one embodiment. The data center system can represent a top view of data center 100 of FIG. 1. Referring to FIG. 2, the electronic racks are arranged into a number of rows such as rows 104-105. The rows of electronic racks are positioned and spaced apart from each other to form cold aisles 114A-114C (collectively referred to as cold aisles 114) and hot aisles 115A-115D (collectively referred to as hot aisles). Hot aisles 115A-115D are each enclosed or contained in a hot aisle containment structure. Cold air room 102 is positioned adjacent to a first side of IT room 101. Hot air room 103 is positioned adjacent to a second side of IT room 101.

In this example, the first side and the second side of the IT room 101 are opposite sides. The cold air is received from an external cold air source such as an IDEC system via one or more inlet or intake ports 201 into cold air room 102. The cold air then enters IT room 101 via one or more openings (e.g., windows, doors) 211-213 and enter cold aisles 114A-114C. The cold air then enters from the frontends of the electronic racks, travels through the airspace of the electronic racks, and enters hot aisles 115A-115D. As described above, hot aisles 115 are configured as an enclosed or contained environment that can receive the air flows from cold aisles through the airspace of the electronic racks. The hot air is prevented from spilling into other areas of IT room 101. The hot air can only exit IT room 101 and enter into hot air room 103 via openings 221-224.

In one embodiment, at least one of the openings 211-213 disposed on a wall between cold air room 102 and IT room 102 includes a door to allow an operator or user to enter IT room 101 and cold aisles to access the electronic racks such as frontends of the electronic racks for maintenance services. Similarly, each of openings 221-224 (no doors) allow an operator or user to enter the corresponding hot aisle to access the backend of the electronic racks adjacent to the hot aisle.

Figure 3:
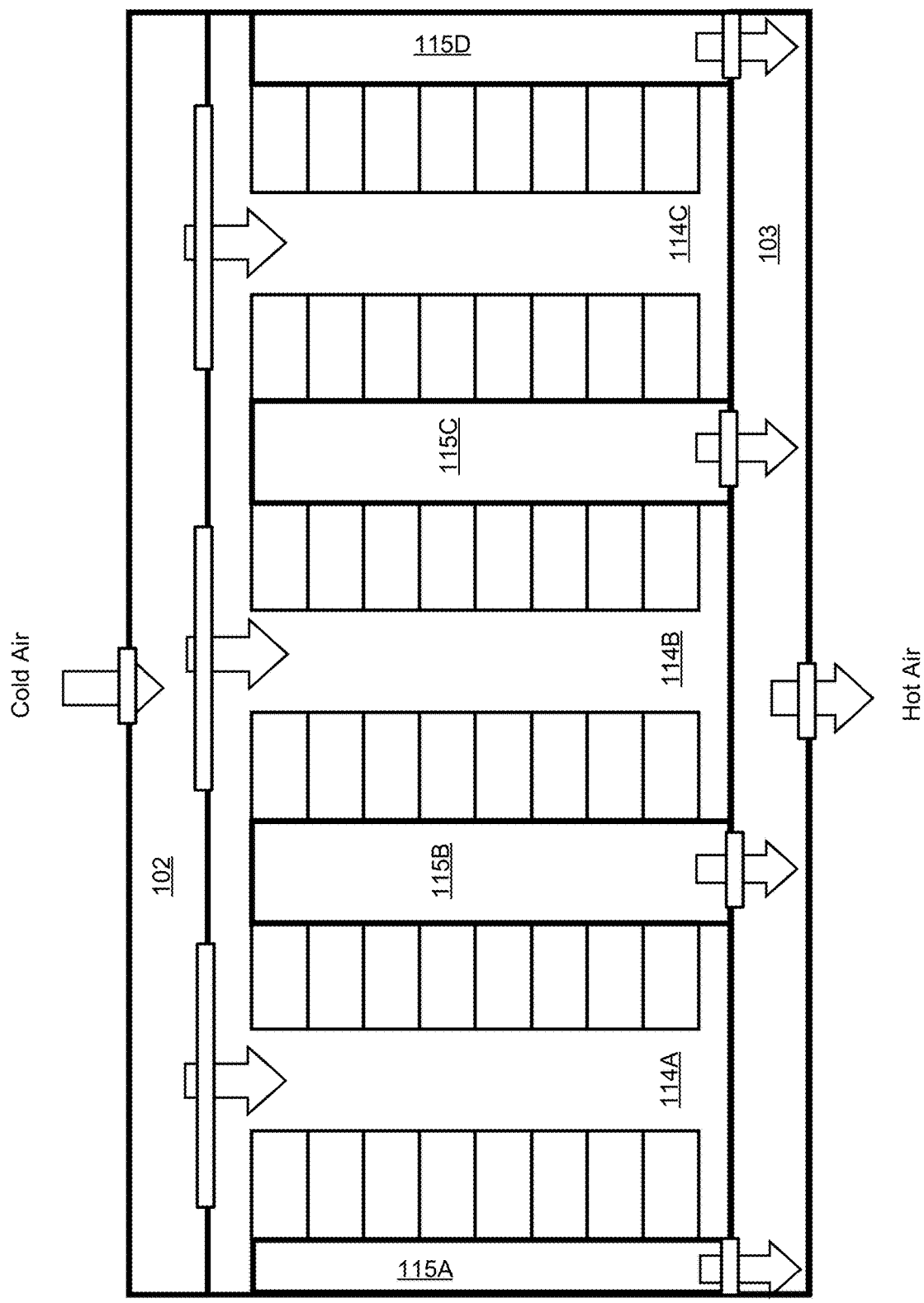
FIG. 3 shows a top view of a data center system according to another embodiment.

In this embodiment, the cold air enters into cold air room 102 via inlet 201 from the third side (e.g., the right hand side) of IT room 101. The hot air leaves hot air room via outlet 202 of IT room 101 from the third side. The third side is different from the first side adjacent to cold air room 102 and the second side adjacent to hot air room 103. In one embodiment, the first side and the second side are substantially parallel to each other. The third side is substantially perpendicular to the first side and/or the second side. Alternatively, according to another embodiment as shown in FIG. 3, the cold air enters cold air room 102 from a side parallel to the first side. The hot air leaves hot air room 103 from a side parallel to the second side.

Figure 4:
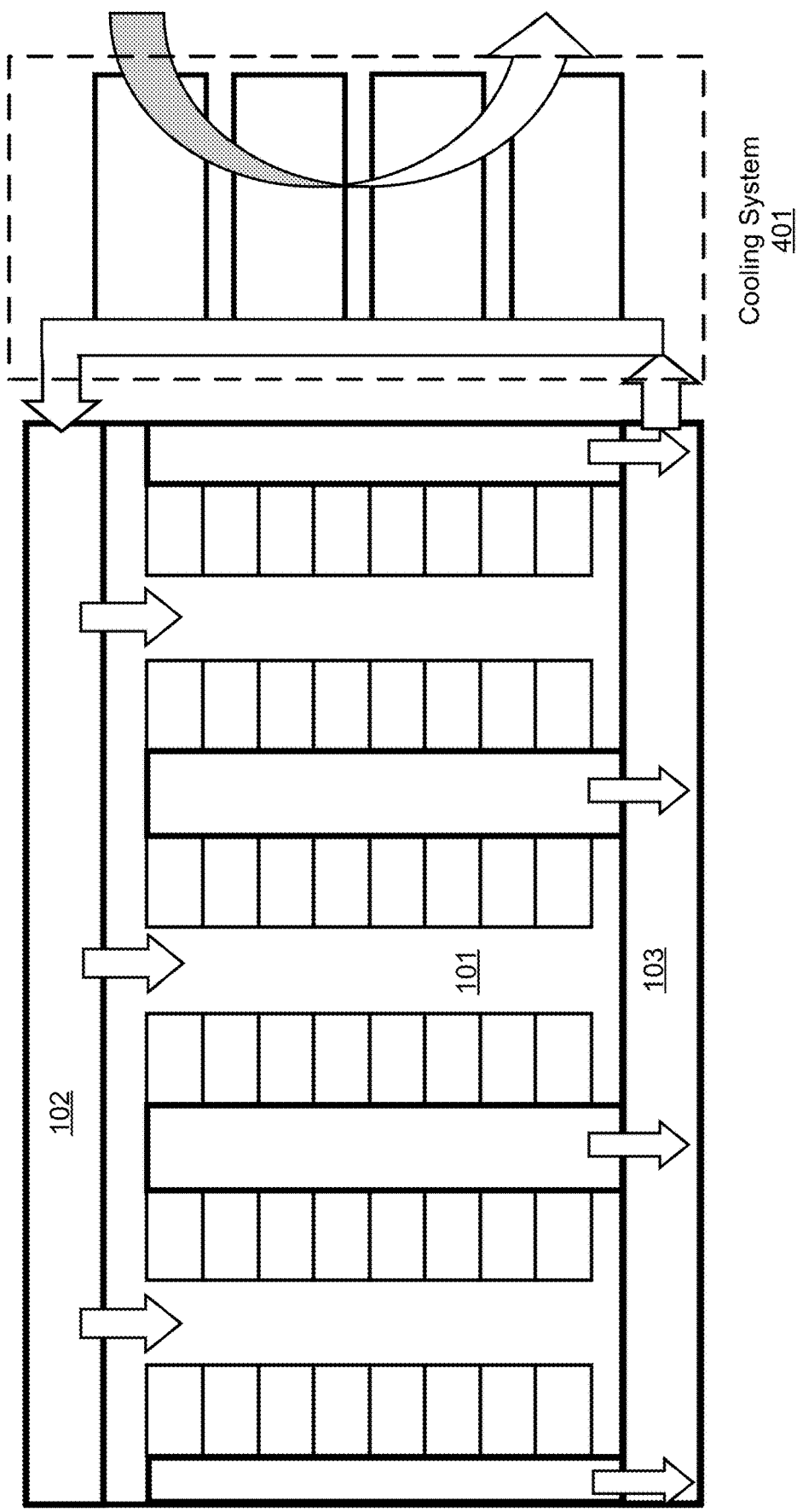
FIG. 4 shows a top view of a data center system according to another embodiment.
Figure 5:
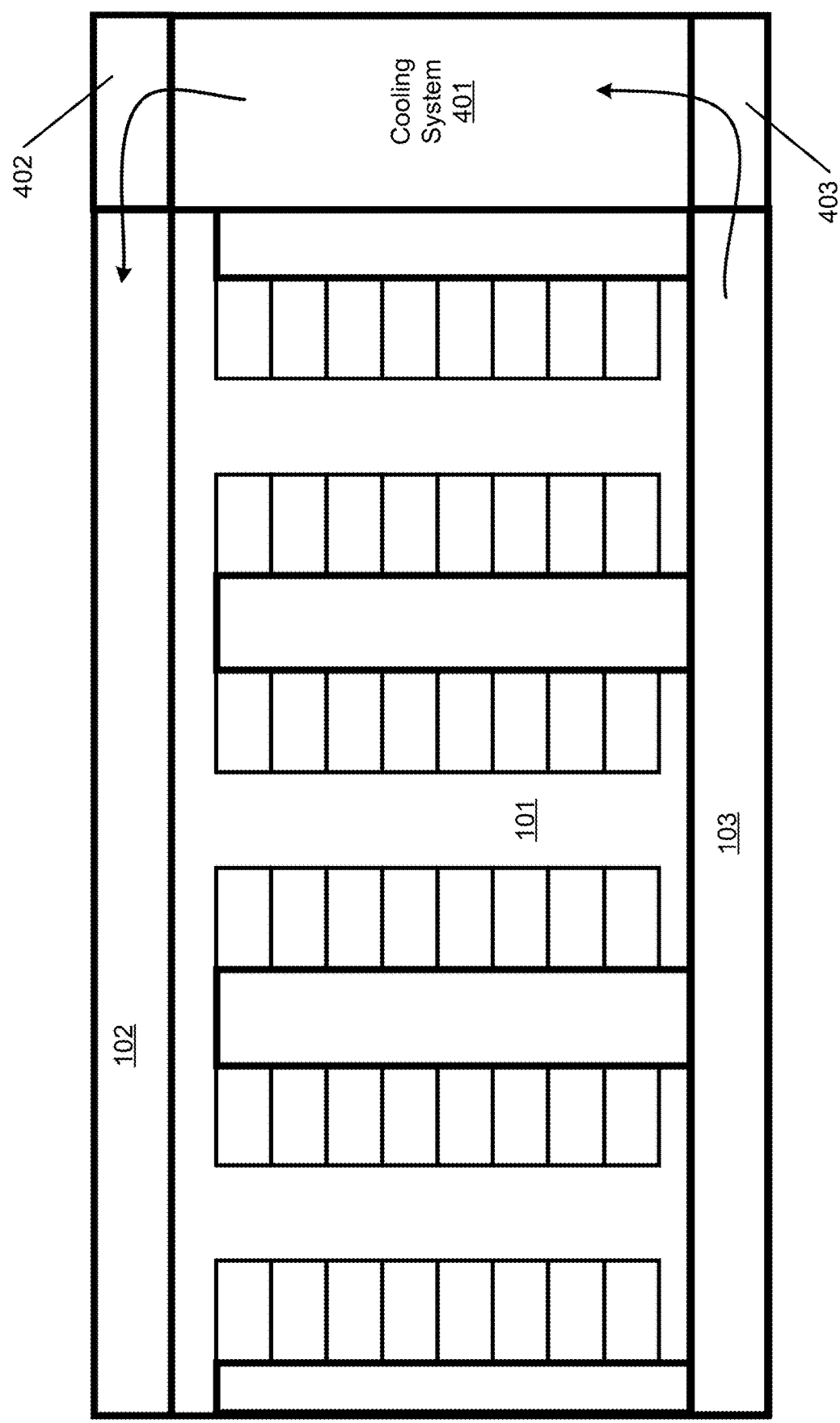
FIG. 5 shows a top view of a data center system according to another embodiment.

In the configurations as shown in FIGS. 2 and 3, the cold air is directly injected into cold air room 102 from external ambient environment with filtering. The hot air is exhausted from hot air room 103 back to the external environment. According to another embodiment, as shown in FIG. 4, cold air room 102 and hot air room 103 are coupled to a cooling system such as an IDEC 401 for heat exchange via airflow channels 402-403. The external cooling system may be configured as a modular system that can be coupled to cold air room 102 and hot air room 103, as shown in FIG. 5, where the cooling system 401 may be provided by a third party entity that is different than an entity providing or maintaining the data center system. Similarly, cold air room 102 and/or hot air room 103 may be configured as a modular module, which can be provided by a third party entity. Cold air room 102, hot air room 103, and/or cooling system 401 may be provided by the same or different vendors or organizations.

Figure 7:
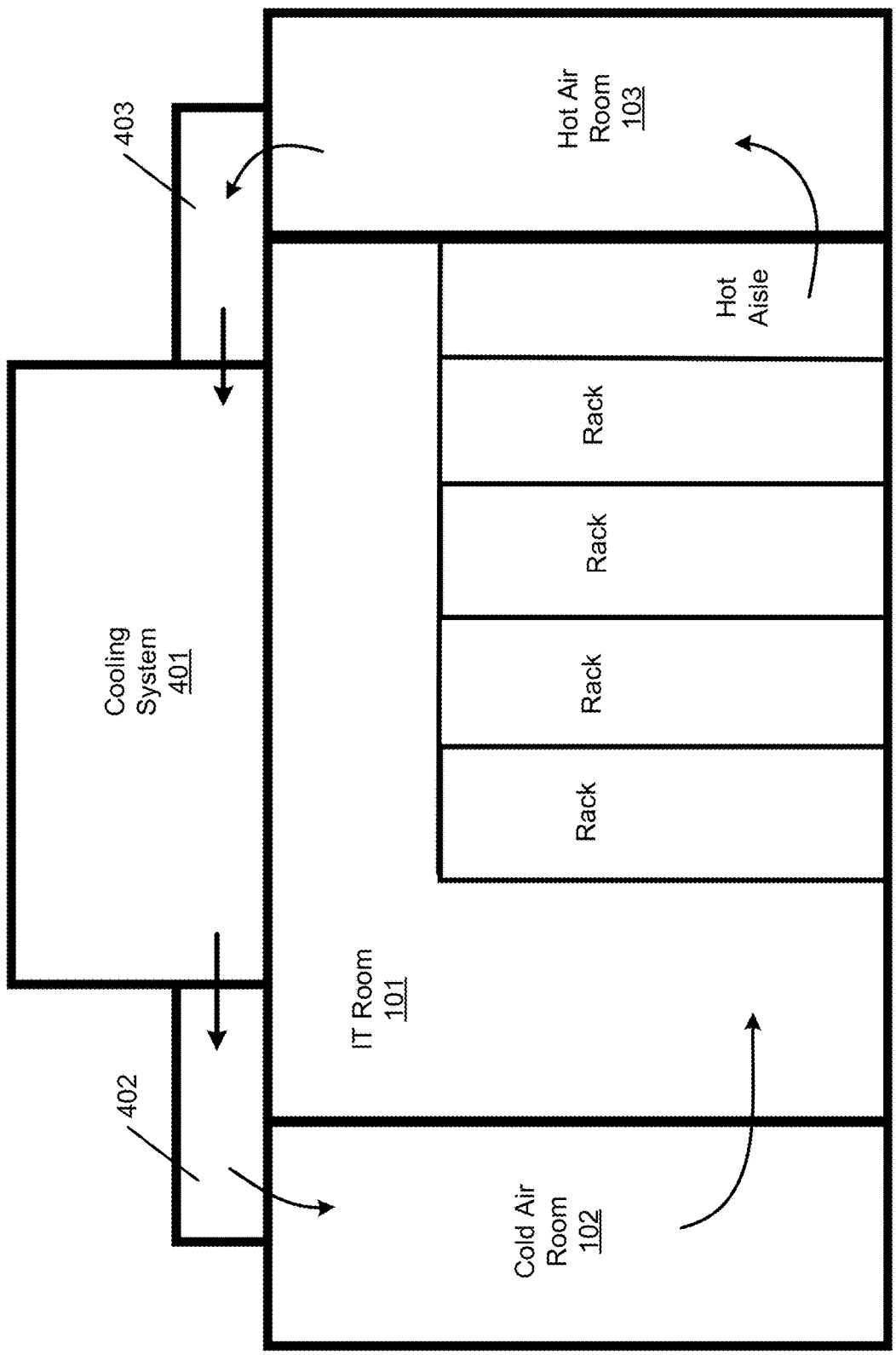
FIG. 7 shows a side view of a data center system according to one embodiment.

Referring to FIG. 5, the data center design includes the following modules: 1) cold air room 102; 2) IT room 101; 3) hot air room 103; 4) external cooling source 401; and 5) Airflow channels 402-403. FIG. 7 shows a schematic representation of another design fashion. The external cooling unit 401 is arranged on the top of the building in this fashion. Cold air room 102 is configured for receiving cooling air from external cooling source 401 and supplying the cooling air to IT room 101. IT room 101 includes server and IT racks housed therein, and the hot air containment solution is utilized. Hot air room 102 is connected with the hot aisles in the IT room 101 and receives hot exhaust air from the IT room 101. The external cooling source 401 can be any type of air cooling equipment or ambient air. Air flow channels 402-403 include air channels or air duct for creating air flow path between cooling source 401 and cold air room 102 and hot air room 103.

Figure 6:
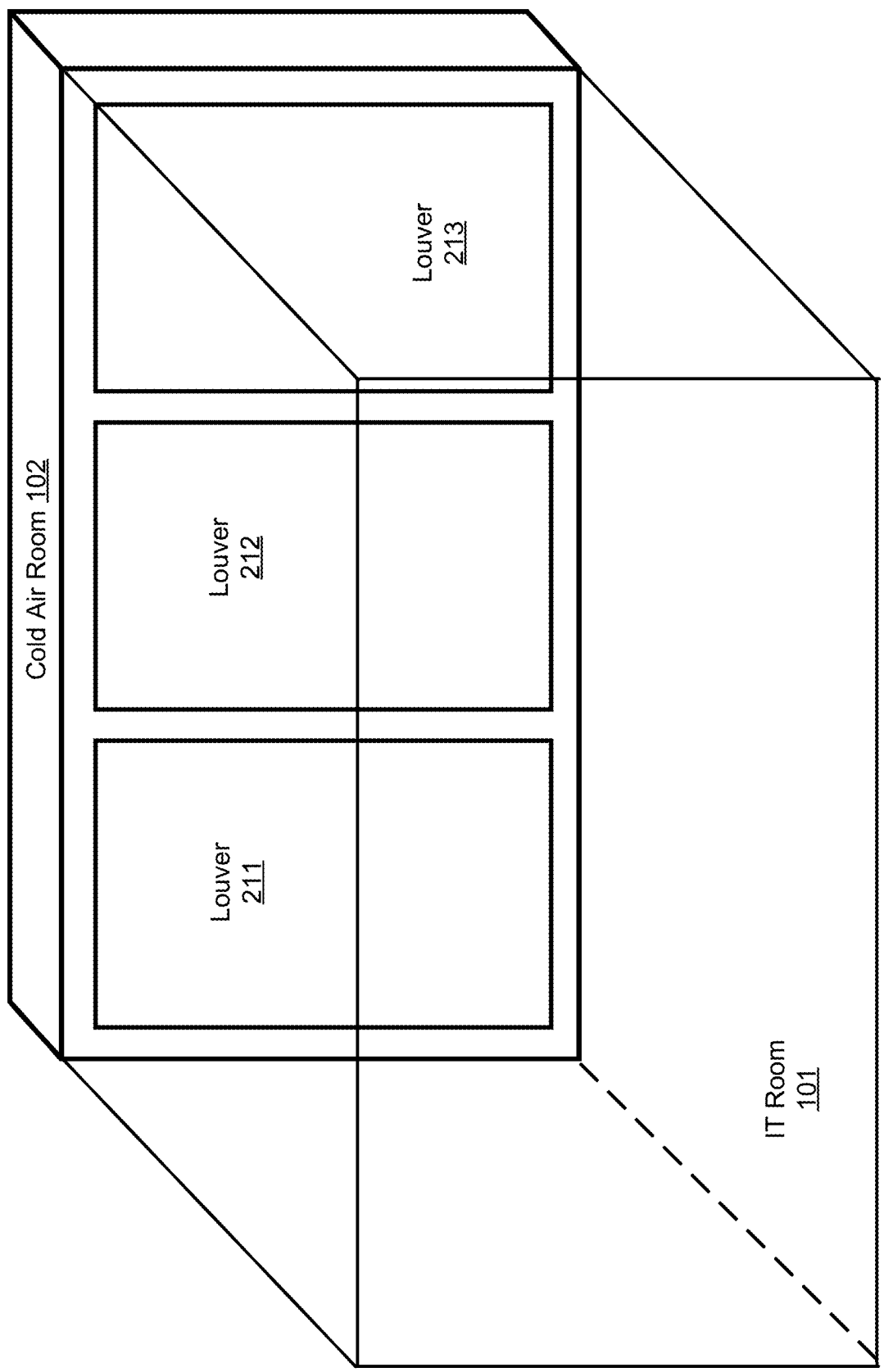
FIG. 6 shows an example of a cold air room with louvers according to one embodiment.

Referring back to FIG. 2, when cold air enters IT room 101 from cold air room 102, the cold air is not distributed evenly. For example, the air pressure on opening 211 may be lower than the air pressure on opening 212 or opening 213, because opening 211 is farther away from inlet 201. According to one embodiment, louvers or air valves are used on the openings 211-213, as shown in FIG. 6. The open ratio of the louvers or the air valve can be adjusted. By adjusting the open ratio of the louvers, the pressure distribution dynamics within cold air room 102 can be adjusted, and the air can be more evenly supplied to IT room 101. Referring to FIG. 6, the pattern or configuration of the louvers mounted on openings 211-213 can be configured differently to control the air flow pressure entering IT room 101 from cold air room 102, such that the cold air can be evenly distributed within IT room 101.

The cooling system described in the data center configuration above is located on the side of the IT room 101. However, the cooling system can also be implemented on the top of the IT room 101 as shown in FIG. 7, which shows a side view of a data center system. Other configurations may also be implemented.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A data center system, comprising:
an information technology (IT) room containing a plurality of electronic racks, each electronic rack of the plurality of electronic racks having a plurality of heat-generating IT components in a stack, wherein the plurality of electronic racks are arranged in a first row of electronic racks having a front end that receives cold air from a cold aisle of the IT room and a back end that exhausts hot air into a hot aisle in the IT room, the first row of electronic racks being otherwise enclosed, and the hot aisle is enclosed by a containment structure that prevents the hot air from spilling into the cold aisle of the IT room, wherein the first row of electronic racks is positioned between the cold aisle and the hot aisle to allow an airflow flowing from the cold aisle to the hot aisle through an airspace of the plurality of electronic racks to exchange heat generated from the heat-generating IT components;
a cold air room disposed adjacent to a first side of the IT room, wherein the cold air room is to receive cold air from a cold air source and to distribute the cold air to the cold aisle; and
a hot air room disposed adjacent to a second side of the IT room that is opposite to the first side, wherein the hot air room to receives the hot air from the hot aisles and returns the hot air to the cold air source for heat exchange, wherein the containment structure of the hot aisle is coupled to the hot air room such that the hot air in the hot air aisle is prevented from spilling into the cold aisle of the IT room, and the hot includes one or more openings that a person to fully walk into the hot aisle from the hot air room and enable the person to access the back end of the first row of electronic racks from the hot aisle.

2. The data center system of claim 1, further comprising:
a second row of electronic racks having a front end that receives cold air from a second cold aisle and a back end that exhausts hot air into the hot aisle, the second row of racks being otherwise enclosed.

3. The data center system of claim 1, wherein the cold air room disposed adjacent to the first side of the IT room is not the floor side of the IT room.

4. The data center system of claim 1, wherein the hot air is exhausted from the hot aisle into the hot air room through the one or more openings between the hot aisle and the hot air room on the second side of the IT room and at least one of the one or more openings comprises a door that permits the person to enter the hot air aisle.

5. The data center system of claim 4, wherein the one or more openings allow the person to fully walk into the hot aisle to provide services to the back end of the first row of electronic racks.

6. The data center system of claim 1, wherein the cold air enters the IT room from the cold air room through one or more openings between the IT room and the cold air room.

7. The data center system of claim 6,
wherein the one or more openings between the IT room and the cold air room include one or more doors to allow the person to enter the cold aisle to access the front end of the first row of electronic racks.

8. The data center system of claim 1, wherein the cold air is received from the cold air source via one or more inlet ports disposed on a wall of the cold air room.

9. The data center system of claim 8, wherein the wall of the cold air room with the one or more inlet ports disposed thereon is substantially parallel with a third side of the IT room.

10. The data center system of claim 9, wherein the third side is substantially perpendicular to the first side and the second side of the IT room.

11. The data center system of claim 8, wherein the wall of the cold air room is substantially in parallel with the first side of the IT room.

12. The data center system of claim 1, wherein the hot air is returned from the hot air room back to the cold air source via one or more outlet ports disposed on a wall of the hot air room.

13. The data center system of claim 12, wherein the wall of the hot air room with the one or more outlet ports disposed thereon is substantially parallel with a third side of the IT room.

14. The data center system of claim 13, wherein the third side is substantially perpendicular to the first side and the second side of the IT room.

15. The data center system of claim 12, wherein the wall of the hot air room is substantially in parallel with the second side of the IT room.

16. The data center system of claim 1, wherein the cold air source is located above the IT room.

17. The data center system of claim 1, wherein the cold air source is located outside of the IT room.

18. The data center system of claim 1, further comprising:
a door that enables the person to enter the hot air room from outside the IT room.

* * * * *